United States Patent
Zhang et al.

(10) Patent No.: US 11,450,799 B2
(45) Date of Patent: Sep. 20, 2022

(54) MICRON-SCALE MONOCRYSTAL FILM

(71) Applicant: Jinan Jingzheng Electronics Co., Ltd., Shandong (CN)

(72) Inventors: Xiuquan Zhang, Shandong (CN); Houbin Zhu, Shandong (CN); Wen Hu, Shandong (CN); Juting Luo, Shandong (CN); Hui Hu, Shandong (CN); Yangyang Li, Shandong (CN)

(73) Assignee: Jinan Jingzheng Electronics Co., Ltd., Shandong (CN)

( * ) Notice: Subject to any disclaimer, the term of this patent is extended or adjusted under 35 U.S.C. 154(b) by 311 days.

(21) Appl. No.: 16/772,909

(22) PCT Filed: Aug. 7, 2018

(86) PCT No.: PCT/CN2018/099157
§ 371 (c)(1),
(2) Date: Jun. 15, 2020

(87) PCT Pub. No.: WO2020/029069
PCT Pub. Date: Feb. 13, 2020

(65) Prior Publication Data
US 2020/0313068 A1    Oct. 1, 2020

(51) Int. Cl.
*H01L 41/08*    (2006.01)
*C30B 29/18*    (2006.01)
(Continued)

(52) U.S. Cl.
CPC .......... *H01L 41/0815* (2013.01); *C30B 29/18* (2013.01); *C30B 29/30* (2013.01);
(Continued)

(58) Field of Classification Search
CPC ... H01L 41/0815; H01L 41/1873; H03H 9/17; H03H 9/56; C30B 29/30; C30B 29/18
See application file for complete search history.

(56) References Cited

U.S. PATENT DOCUMENTS

| 2012/0228613 A1 | 9/2012 | Seki et al. |
| 2013/0192878 A1 | 8/2013 | Kijima et al. |
| 2019/0051525 A1* | 2/2019 | Akiyama ............ H01L 21/425 |

FOREIGN PATENT DOCUMENTS

| CN | 104868050 A | 8/2015 |
| CN | 105321806 A | 2/2016 |

(Continued)

OTHER PUBLICATIONS

Extended European Search Report for Europe Patent Application No. 18929374.9, dated Jun. 29, 2021, 6 pages.

*Primary Examiner* — J. San Martin
(74) *Attorney, Agent, or Firm* — Bret E. Field; Bozicevic, Field & Francis LLP

(57) ABSTRACT

The invention provides a micron-scale monocrystal film. The micron-scale monocrystal film includes 1) a substrate layer, and 2) a micron-scale monocrystal film layer located on the substrate layer, wherein a transition layer is interposed between the substrate layer and micron-scale monocrystal film layer, and the transition layer may include a first transition layer disposed adjacent to the substrate layer and a second transition layer disposed adjacent to the micron monocrystal film layer, wherein the transition layer may include H and an element from at least one kind of plasma gas used during the plasma bonding of the substrate layer and the micron-scale monocrystal film layer.

9 Claims, 5 Drawing Sheets

(51) Int. Cl.
  *C30B 29/30*   (2006.01)
  *H01L 41/312*  (2013.01)
  *H01L 41/187*  (2006.01)
  *H03H 9/17*    (2006.01)
  *H03H 9/56*    (2006.01)

(52) U.S. Cl.
  CPC ........ *H01L 41/312* (2013.01); *H01L 41/1873* (2013.01); *H03H 9/17* (2013.01); *H03H 9/56* (2013.01)

(56) References Cited

FOREIGN PATENT DOCUMENTS

| | | |
|---|---|---|
| CN | 105420674 A | 3/2016 |
| EP | 0651449 A2 | 5/1995 |
| JP | 2017-139720 A | 8/2017 |
| JP | 2017-188550 A | 10/2017 |
| JP | 2018-061226 A | 4/2018 |
| JP | 2018-117030 A | 7/2018 |
| WO | WO0175195 A2 | 10/2001 |

\* cited by examiner

MICRON-SCALE MONOCRYSTAL FILM

FIELD OF TECHNOLOGY

The invention relates to a micron-scale monocrystal film.

BACKGROUND

Lithium tantalate/lithium niobate monocrystal film, which is prepared with a silicon material as substrate, can be used to produce filters, optical waveguide modulators, optical waveguide switches, spatial light modulators, optical frequency doublers, surface acoustic wave generators, infrared detectors, ferroelectric memory, etc., and can bring about great economic and social benefits.

SUMMARY

The invention provides a micron-scale monocrystal film including a micron monocrystal film layer and is capable of reducing acoustic wave loss and insertion loss of a filter.

According to an exemplary embodiment of the present invention, the micron-scale monocrystal film includes 1) a substrate layer and 2) a micron monocrystal film layer located on the substrate layer, wherein a transition layer may be interposed between the substrate layer and the micron monocrystal film layer. The transition layer may include a first transition layer disposed adjacent to the substrate layer and a second transition layer disposed adjacent to the micron monocrystal film layer, wherein the transition layer may include H and an element of at least one kind of plasma gas used during the plasma bonding of the substrate layer and micron monocrystal layer.

According to an exemplary embodiment of the present invention, the plasma gas may be at least one of Ar, $O_2$, and $N_2$.

According to an exemplary embodiment of the present invention, the micron monocrystal film layer may have a thickness ranging from 5 to 50 µm.

According to an exemplary embodiment of the present invention, the concentration of H in the transition layer may range from $1 \times 10^{20}$ to $1 \times 10^{22}$ atoms/cc. The concentration of H may have a maximum value in the transition layer, and from the position with the maximum value, the concentration of H may be gradually decreased toward the micron monocrystal film layer and substrate layer.

According to an exemplary embodiment of the present invention, the first and second transition layers may each have a thickness ranging from 0.5 to 10 nm.

According to an exemplary embodiment of the present invention, the thickness of the substrate layer may range from 0.1 to 1 mm.

According to an exemplary embodiment of the present invention, the micron monocrystal film layer may be a lithium niobate monocrystal film, lithium tantalate monocrystal film, or quartz monocrystal film.

According to an exemplary embodiment of the present invention, the substrate layer may be a silicon substrate, lithium niobate substrate, lithium tantalate substrate, quartz substrate, silicon carbide substrate, or sapphire substrate.

According to an exemplary embodiment of the present invention, the materials for forming the micron monocrystal film layer and substrate layer may be the same or different from each other.

According to an exemplary embodiment of the present invention, from the first transition layer to the second transition layer, the content of the element from the substrate layer may be gradually reduced, and the content of the element from the micron monocrystal film layer may be gradually increased.

According to an exemplary embodiment of the present invention, the micron monocrystal film layer may have a polished surface or a rough surface with micron- or sub-micron-scale roughness.

BRIEF DESCRIPTION OF THE DRAWINGS

These and/or other aspects will become clearer and easier to understand through the following description of the embodiments in conjunction with the accompanying drawings, in which.

DESCRIPTION OF THE EMBODIMENTS

Figure 1:
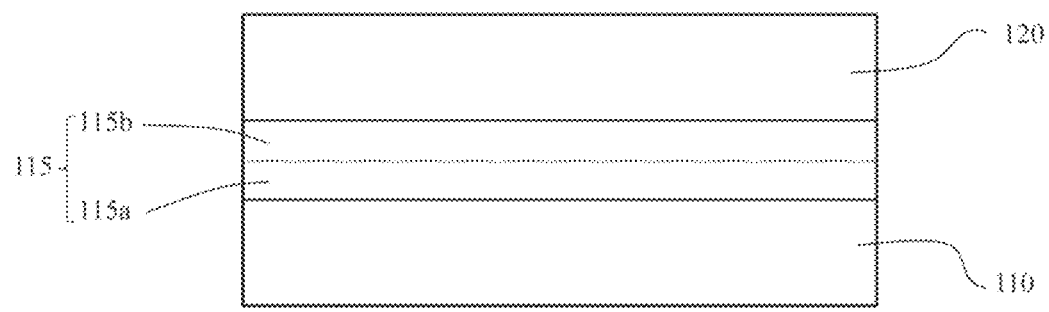
FIG. 1 shows a schematic illustrating the structure of a micron-scale monocrystal film according to an embodiment of the present invention.

Embodiments of the invention will now be described more fully with reference to the accompanying drawings, in which embodiments of the invention are illustrated. The invention may, however, be embodied in many different forms and should not be construed as limited to the embodiments set forth herein. These embodiments are provided to make the disclosure thorough and complete, and these embodiments will fully convey to those of ordinary skill in the art the concept of the embodiments of the present invention. In the following description, various specific details are set forth by way of examples to provide a full understanding of the relevant teachings. However, those skilled in the art will understand that the present teachings can be practiced without such details. In other instances, well-known methods, steps, and components have been described without going into detail in order to avoid unnecessarily obscuring various aspects of the present teachings. The same reference numerals in the drawings denote the same elements, and thus descriptions thereof will not be repeated. In the drawings, the size and relative size of layers and regions may be exaggerated for clarity.

The present invention will now be described more fully hereinafter with reference to the accompanying drawings.

FIG. 1 shows a schematic illustrating the structure of a micron-scale monocrystal film according to embodiments of the present invention.

Referring to FIG. 1, a micron-scale monocrystal film according to embodiments of the present invention may include 1) a substrate layer 110 and 2) a micron monocrystal film layer 120 located on the substrate layer 110, wherein a transition layer 115 is interposed between the substrate layer 110 and micron monocrystal film layer 120. The transition layer 115 includes a first transition layer 115a disposed adjacent to the substrate layer 110 and a second transition layer 115b disposed adjacent to the micron monocrystal film layer 120.

According to embodiments of the present invention, a micron-scale monocrystal film can be prepared as a wafer, which may have a diameter of 2-12 in.

According to embodiments of the present invention, the substrate layer 110 of the micron-scale monocrystal film may mainly play a supporting role. According to embodiments of the present invention, the substrate layer 110 may be a silicon substrate, lithium niobate substrate, lithium tantalate substrate, quartz substrate, silicon carbide substrate, or sapphire substrate. However, the present invention is not limited thereto, and other suitable materials can be used. In addition, the substrate layer 110 according to embodiments of the present invention may have a thickness of 0.1-1 mm. Preferably, the thickness of the substrate layer 110 may be 0.1-0.2 mm, 0.3-0.5 mm, or 0.2-0.5 mm.

According to embodiments of the present invention, the micron monocrystal film layer 120 of the micron-scale monocrystal film may be a lithium niobate monocrystal film, lithium tantalate monocrystal film, or quartz monocrystal film, but the present invention is not limited thereto. According to embodiments of the present invention, the materials for forming the micron monocrystal film layer 120 and substrate layer 110 may be the same or different from each other. In addition, the micron monocrystal film layer 120 according to embodiments of the present invention may have a thickness of 5-50 μm. Preferably, the thickness of the micron monocrystal film layer 120 may be 5-15 μm, 20-30 μm, or 35-50 μm. In addition, the surface of the micron monocrystal film layer 120, opposite the substrate layer 110, may be a polished or rough surface with a micron- or sub-micron-scale roughness, but the present invention is not limited thereto.

According to embodiments of the present invention, the substrate layer 110 and micron monocrystal film layer 120 may be bonded together by a plasma bonding method, but the present invention is not limited thereto.

According to embodiments of the present invention, a transition layer 115 may be interposed between the substrate layer 110 and micron monocrystal film layer 120, and the transition layer 115 may include a first transition layer 115a disposed adjacent to the substrate layer 110 and a second transition layer 115b disposed adjacent to the micron monocrystal film layer 120.

According to embodiments of the present invention, the first transition layer 115a and second transition layer 115b may each have a thickness of 0.5-10 nm. Preferably, both thicknesses of the first transition layer 115a and second transition layer 115b may be 0.5-5 nm, 5.5-nm, or 7.5-10 nm.

According to embodiments of the present invention, the first transition layer 115a and second transition layer 115b may contain elements inherent in the substrate layer 110 and micron monocrystal film layer 120. From the first transition layer 115a toward the second transition layer 115b, the contents of elements from the substrate layer 110 gradually decrease, and the contents of elements from the micron monocrystal film layer 120 gradually increase.

In addition, according to embodiments of the present invention, the transition layer 115 may further include H and an element of at least one kind of the plasma gases used in the plasma treatment of the substrate layer and micron monocrystal layer. The plasma gas according to embodiments of the present invention may include at least one of Ar, $O_2$, and $N_2$, but the present invention is not limited thereto. The element of the gas used in the plasma treatment is derived from the plasma used during the plasma bonding of the substrate layer 110 and micron monocrystal film layer 120. The first transition layer 115a and second transition layer 115b may have the element H, because when the surfaces of the substrate layer 110 and micron monocrystal film layer 120 are treated with plasma, the surfaces may be changed by the bombardment of the plasma in that a large number of active chemical bonds may be formed on the surfaces, thereby making the surfaces have higher activity. Therefore, when exposed to air or washed with water after the plasma treatment, the surfaces may adsorb a large number of water molecules or hydroxyl, which can enhance the bonding force, so that, after the bonding of the substrate layer 110 and the micron monocrystal film layer 120, a certain concentration of H element may exist in the bonding interface therebetween.

According to embodiments of the present invention, the concentration of H in the transition layer 115 may range from $1\times10^{20}$ to $1\times10^{22}$ atoms/cc. In addition, the concentration of H may have a maximum value in the transition layer 115, and from the position with the maximum value, the concentration of H may gradually decrease toward the micron monocrystal film layer 120 and substrate layer 110.

The stress between the substrate layer 110 and micron monocrystal film layer 120 can be dispersed by the first transition layer 115a and second transition layer 115b in the micron-scaled monocrystal film according to embodiments of the present invention. Owing to the stress dispersion, the defects of the micron monocrystal film layer 120 can be reduced, and thus the quality of the micron monocrystal film layer 120 can be improved so as to reduce the transmission loss. In addition, there are flat boundary lines between the substrate layer 110 and first transition layer 115a, between the first transition layer 115a and second transition layer 115b, and between the second transition layer 115b and micron monocrystal film layer 120. With such structure, the loss of sound waves can be reduced, so that the insertion loss of the filter is reduced.

The bonding force between the substrate layer 110 and micron monocrystal film layer 120 can be enhanced as a result of the element H and the element of at least one kind of the plasma gases are included in the transition layer of the micron-scaled monocrystal film according to embodiments of the present invention. When the concentration of H is in the range from $1\times10^{20}$ to $1\times10^{22}$ atoms/cc, the bonding force is the strongest.

The invention is illustrated in more detail by the following examples. However, these examples should not be construed as limiting the scope of the invention in any sense.

Manufacturing of micron-scale monocrystal films

Example 1: Micron-Scaled Lithium Tantalate Monocrystal Film with a Polished Surface A monocrystal lithium tantalate wafer having a size of 4 in. and a thickness of 0.5 mm and having at least one polished surface is prepared. A monocrystal silicon substrate wafer having a size of 4 in. and a thickness of 0.5 mm and having at least one polished surface is prepared.

The monocrystal lithium tantalate wafer and monocrystal silicon wafer are both cleaned.

The cleaned monocrystal lithium tantalate wafer and monocrystal silicon wafer are both treated with Ar plasma. Subsequently, the plasma-treated monocrystal lithium tantalate wafer and monocrystal silicon wafer are directly bonded at room temperature to obtain a bonded body of the monocrystal lithium tantalate wafer and monocrystal silicon wafer.

The resultant bonded body is heated at a temperature of 130° C. to improve the bonding force thereof.

The monocrystal lithium tantalate wafer of the resultant bonded body is ground to a thickness of 22 μm, and then is polished on the grinded surface to a thickness of 20 μm.

Finally, the resultant bonded body is heated at 240° C. to improve the bonding force thereof, so that the lithium tantalate monocrystal film with a micron-scale thickness and a polished surface is obtained.

Example 2: Micron-Scale Lithium Tantalate Monocrystal Film Having a Surface with Sub-Micron-Scale Roughness A monocrystal lithium tantalate wafer having a size of 4 in. and a thickness of 0.5 mm and having at least one polished surface is prepared. A monocrystal silicon wafer having a size of 4 in. and a thickness of 0.5 mm and having at least one polished surface is prepared.

The monocrystal lithium tantalate wafer and monocrystal silicon wafer are both cleaned.

The cleaned monocrystal lithium tantalate wafer and monocrystal silicon wafer are both treated with O plasma. Subsequently, the plasma-treated monocrystal lithium tantalate wafer and monocrystal silicon wafer are directly bonded at room temperature to obtain a bonded body of the monocrystal lithium tantalate wafer and the monocrystal silicon wafer.

The resultant bonded body is heated at a temperature of 120° C. to improve the bonding force thereof.

The monocrystal lithium tantalate wafer of the resultant bonded body is ground to a thickness of 20 μm.

Finally, the resultant bonded body is heated at 250° C. to improve the bonding force thereof, so that the lithium tantalate monocrystal film with a micron-scale thickness and a surface having sub-micron-scale roughness is obtained.

Example 3: Micron-Scaled Lithium Niobate Monocrystal Film with a Polished Surface A monocrystal lithium niobate wafer with a size of 4 in. and a thickness of 0.5 mm and with at least one polished surface is prepared. A monocrystal silicon wafer with a size of 4 in. and a thickness of 0.5 mm and with at least one polished surface is prepared.

The monocrystal lithium niobate wafer and monocrystal silicon wafer are both cleaned.

The cleaned monocrystal lithium niobate wafer and monocrystal silicon wafer are treated with Ar plasma and O plasma. Subsequently, the plasma-treated monocrystal lithium niobate wafer and monocrystal silicon wafers are directly bonded at room temperature to obtain a bonded body of the monocrystal lithium niobate wafer and monocrystal silicon wafer.

The resultant bonded body is heated at a temperature of 140° C. to improve the bonding force thereof.

The monocrystal lithium niobate wafer of the resultant bonded body is ground to a thickness of 22 μm, and then is polished on the grinded surface to a thickness of 20 μm.

Finally, the resultant bonded body is heated at 220° C. to improve the bonding force thereof, so that the lithium niobate monocrystal film with a micron-scale thickness and a polished surface is obtained.

Example 4: Micron-Scaled Quartz Monocrystal Film with a Polished Surface

A monocrystal quartz wafer with a size of 4 in. and a thickness of 0.5 mm and with at least one polished surface is prepared. A monocrystal silicon wafer with a size of 4 in. and a thickness of 0.5 mm and with at least one polished surface is prepared.

The monocrystal quartz wafer and monocrystal silicon wafer are both cleaned.

The cleaned monocrystal quartz wafer and monocrystal silicon wafer are both treated with Ar plasma and N plasma. Subsequently, the plasma-treated monocrystal quartz wafer and monocrystal silicon wafer are directly bonded at room temperature to obtain a bonded body of the monocrystal quartz wafer and monocrystal silicon wafer.

The resultant bonded body is heated at a temperature of 100° C. to improve the bonding force thereof.

The monocrystal quartz wafer of the resultant bonded body is ground to a thickness of 22 μm, and then is polished on the grinded surface to a thickness of 20 μm.

Finally, the bonded body is heated at 250° C. to improve the bonding force thereof, so that the quartz monocrystal film with a micron-scale thickness and a polished surface is obtained.

Figure 2:
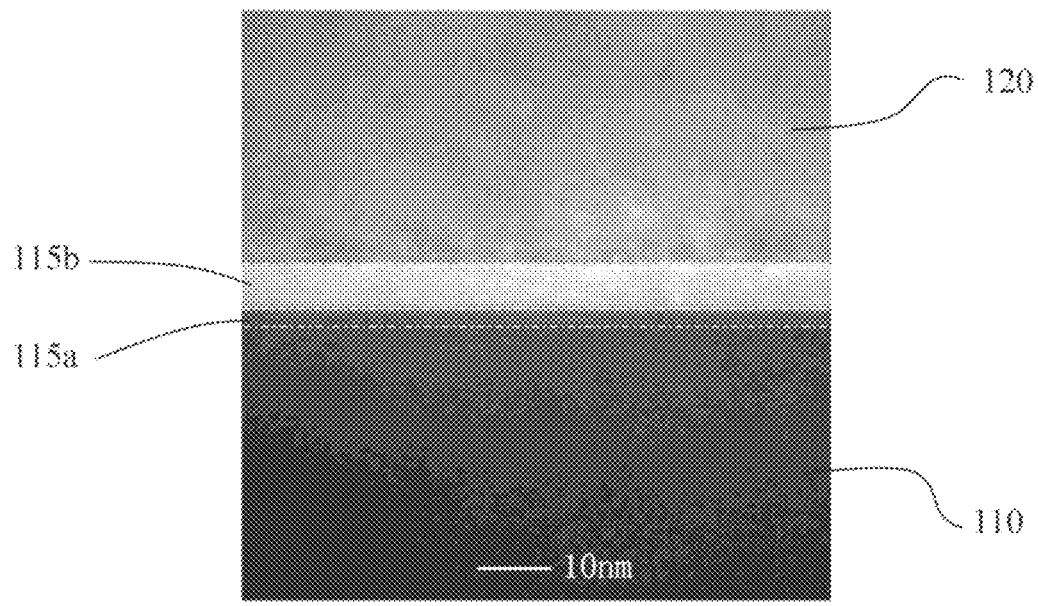
FIG. 2 shows a transmission electron microscope (TEM) image of a micron-scale monocrystal film according to Example 1 of the present invention.

FIG. 2 shows a TEM image of the micron-scale monocrystal film according to Example 1 of the present invention.

Referring to FIG. 2, according to Example 1 of the present invention the substrate layer 110 of the micron-scaled monocrystal film is a silicon substrate, and the micron monocrystal film layer 120 is a micron lithium tantalate monocrystal film with a polished surface. As can be seen from FIG. 2, the micron-scaled monocrystal film according to Example 1 of the present invention has a distinct four-layer structure and includes a first transition layer 115a and second transition layer 115b which are interposed between the substrate layer 110 and micron monocrystal film layer 120, wherein the first transition layer 115a is disposed adjacent to the substrate layer 110, and the second transition layer 115b is disposed adjacent to the micron monocrystal film layer 120. There are distinct boundary lines between any two adjacent layers of the structure in the micron-scale monocrystal film according to embodiments of the present invention, and the boundary lines are relatively flat.

Figure 3:
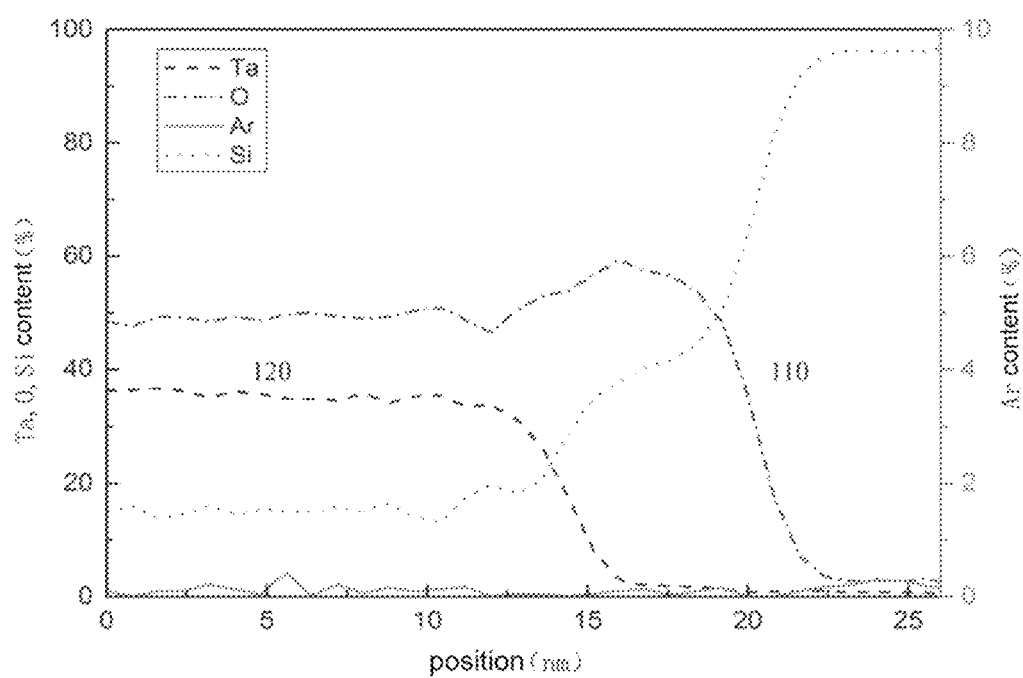
FIG. 3 shows a diagram illustrating the element distribution in the transition layer shown in FIG. 2.

FIG. 3 shows a diagram illustrating the element distribution in the transition layer shown in FIG. 2. It can be seen from FIG. 3 that, in the direction from the micron-scale monocrystal film layer 120 toward the silicon substrate layer 110, the contents of Ta and O from the micron-scale monocrystal film layer 120 gradually decrease, and the content of Si from the silicon substrate layer 110 gradually increases. In addition, the first transition layer 115a and second transition layer 115b contain a small amount of Ar element, which is derived from the plasma used in the treatment of the substrate layer 110 and the micron monocrystal film layer 120 during bonding.

Figure 4:
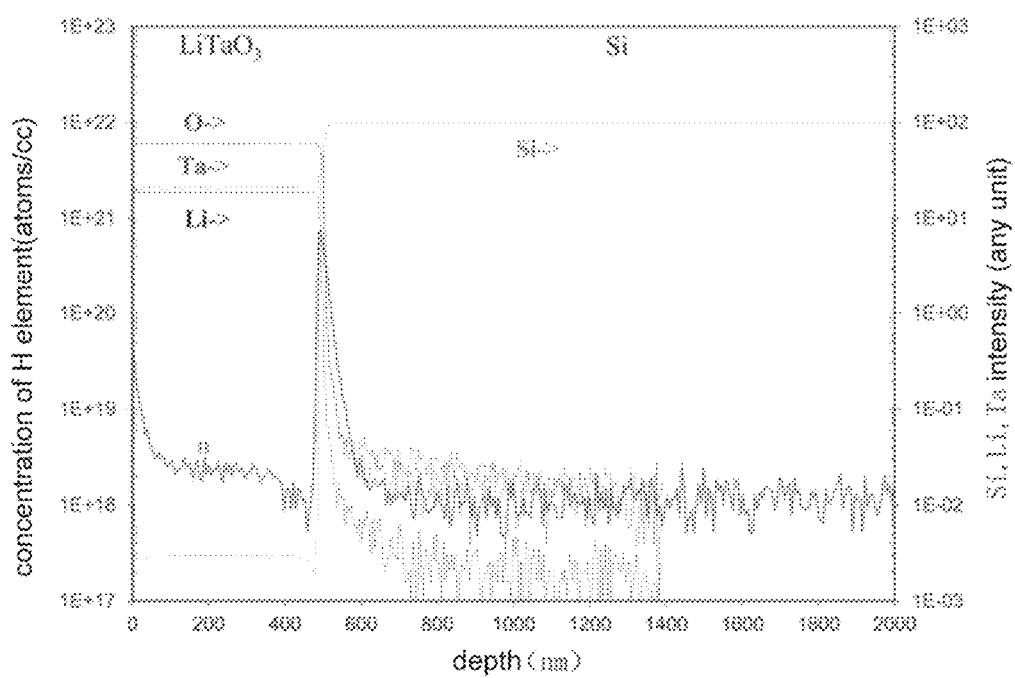
FIG. 4 shows a secondary ion mass spectrum (SIMS) diagram of the micron-scale monocrystal film shown in FIG. 2.

FIG. 4 shows a SIMS diagram of the micron-scale monocrystal film shown in FIG. 2. As can be seen from FIG. 4, the first transition layer 115a and second transition layer 115b contain a higher concentration of H, and the concentration of H ranges from $1 \times 10^{20}$ to $1 \times 10^{22}$ atoms/cc. In addition, the concentration of H may have a maximum value in the first transition layer 115a or second transition layer 115b, and from the position with the maximum value, the concentration of H may gradually decrease toward the micron-scale monocrystal film layer 120 and substrate layer 110.

Figure 5:
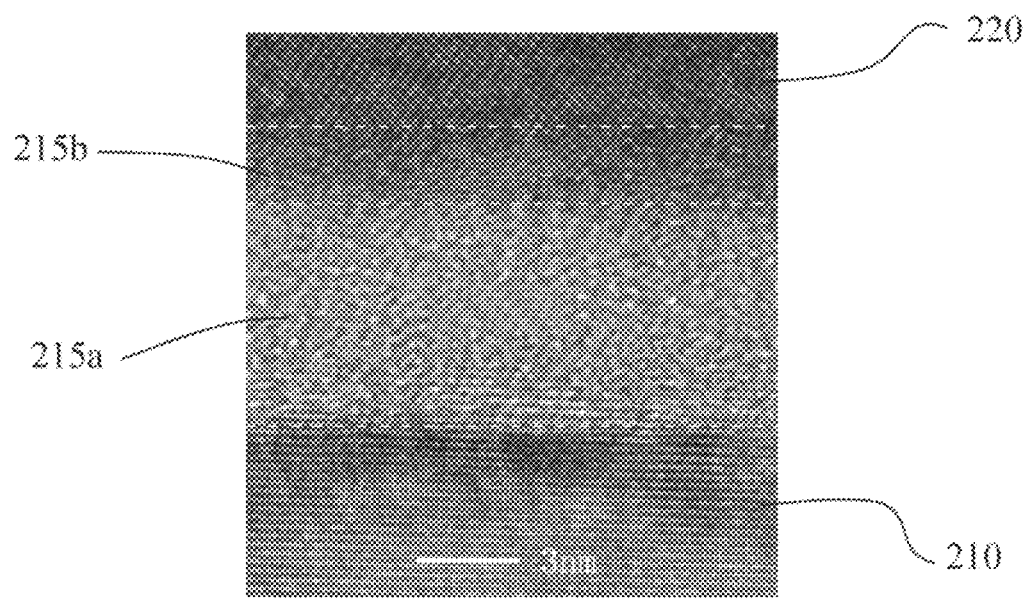
FIG. 5 shows a TEM image of a micron-scale monocrystal film according to Example 3 of the present invention.
Figure 6:
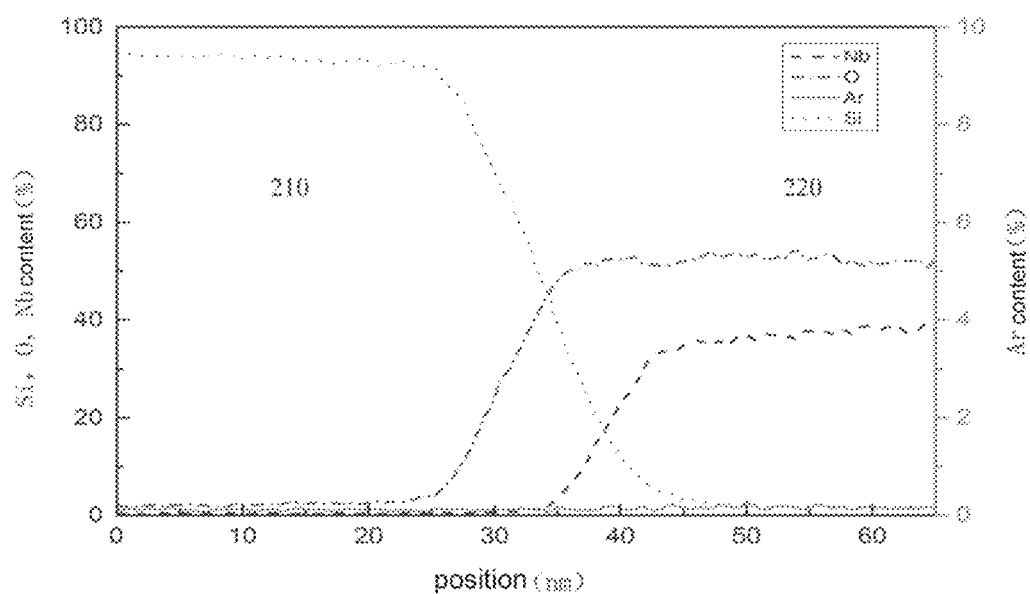
FIG. 6 shows a diagram illustrating the element distribution in the transition layer shown in FIG. 5.
Figure 7:
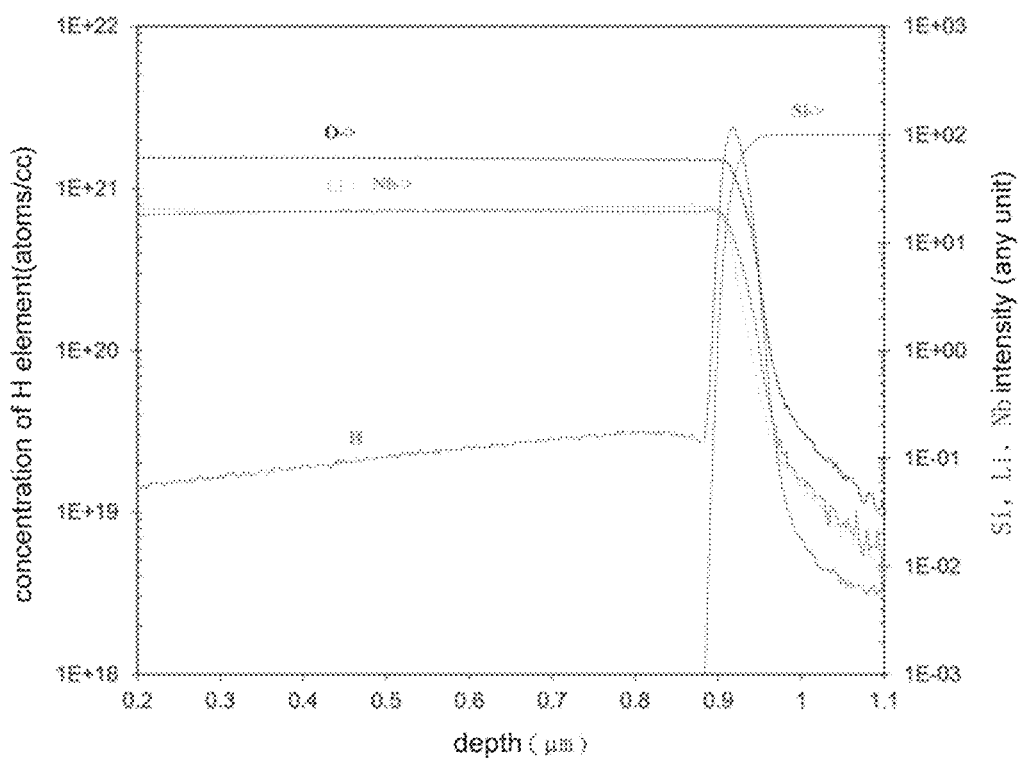
FIG. 7 shows a SIMS diagram of the micron-scale monocrystal film shown in FIG. 5.

FIG. 5 shows a TEM image of a micron-scale monocrystal film according to Example 3 of the present invention; FIG. 6 shows a diagram illustrating the element distribution in the transition layer shown in FIG. 5; FIG. 7 shows a SIMS diagram of the micron-scale monocrystal film shown in FIG. 5.

Except that the micron monocrystal film layer 220 is a micron-scale lithium niobate monocrystal film, the micron-scale monocrystal film in FIGS. 5-7 show substantially the same as the micron-scale monocrystal film in FIGS. 2-4. The differences will be described below.

Referring to FIG. 5, the micron-scale monocrystal film according to Example 3 of the present invention has a distinct four-layer structure, and the surface of the micron monocrystal film layer 220 is a polished surface. The micron-scale monocrystal film of Example 3 includes a first transition layer 215a and a second transition layer 215b, which are located between the substrate layer 210 and micron-scale monocrystal film layer 220. Furthermore, the first transition layer 215a is disposed adjacent to the substrate layer 210, and the second transition layer 215b is disposed adjacent to the micron-scale monocrystal film layer 220. There are distinct boundary lines between any two adjacent layers of the structure in the micron-scale monocrystal film according to embodiments of the present invention, and the boundary lines are relatively flat.

Referring to FIG. 6, in the direction from the micron-scale monocrystal film layer 220 toward the silicon substrate layer 210, the contents of Nb and O from the micron-scale monocrystal film layer 220 gradually decrease, and the content of Si from the silicon substrate layer 210 gradually increases. In addition, the first transition layer 215a and second transition layer 215b contain a small amount of Ar element, which is derived from the plasma used in the treatment of the micron-scale monocrystal film layer 220 during bonding.

Referring to FIG. 7, the first transition layer 215a and second transition layer 215b contain a higher concentration of H, and the concentration of H ranges from $1\times10^{20}$ to $1\times10^{22}$ atoms/cc. In addition, the concentration of H may have a maximum value in the first transition layer 215a or second transition layer 215b, and from the position with the maximum value, the concentration of H may gradually decrease toward the micron-scale monocrystal film layer 220 and the substrate layer 210.

The invention provides a micron-scale monocrystal film including a micron-scale monocrystal film layer. There are two relatively flat transition layers between the substrate layer and micron-scale monocrystal film layer in the micron-scale monocrystal film, so that the loss of sound waves can be reduced and thus the insertion loss of the filter is reduced. In addition, H and an element of at least one kind of the plasma gases are included in the transition layers of the micron-scaled monocrystal film according to the embodiments of the present invention, so that the bonding force between the substrate layer and micron-scale monocrystal film layer is enhanced.

Although the invention has been shown and described in detail with reference to exemplary embodiments thereof, those of ordinary skill in the art will understand that various changes in form and detail can be made here without departing from the spirit and the scope of the invention as defined by the appended claims and their equivalents. The embodiments should be considered only in the sense of description and not for purposes of limitation. Therefore, the scope of the invention is defined not by the specific embodiments of the invention but by the appended claims, and all differences within the scope will be construed as being included in the present invention.

What is claimed is:

1. A micron-scale monocrystal film, comprising
a substrate layer; and
a micron-scale monocrystal film layer located on the substrate layer, wherein
a transition layer is interposed between the substrate layer and the micron-scale monocrystal film layer, and
the transition layer includes a first transition layer disposed adjacent to the substrate layer and a second transition layer disposed adjacent to the micron-scale monocrystal film layer, wherein
the transition layer includes H and an element of at least one kind of plasma gases used during plasma bonding of the substrate layer and the micron-scale monocrystal film layer, wherein
both the first transition layer and the second transition layer include H, wherein
the concentration of H in the transition layer ranges from $1\times10^{20}$ to $1\times10^{22}$ atoms/cc, and wherein
the concentration of H has a maximum value in the transition layer, and from the position with maximum value, the concentration of H gradually decreases toward the micron-scale monocrystal film layer and the substrate layer.

2. The micron-scale monocrystal film according to claim 1, wherein the plasma gas includes at least one of Ar, $O_2$, and $N_2$.

3. The micron-scale monocrystal film according to claim 1, wherein the micron-scale monocrystal film layer has a thickness ranging from 5 to 50 μm.

4. The micron-scale monocrystal film according to claim 1, wherein the first transition layer and second transition layer each have a thickness ranging from 0.5 to 10 nm.

5. The micron-scale monocrystal film according to claim 1, wherein the substrate layer has a thickness ranging from 0.1 to 1 mm.

6. The micron-scale monocrystal film according to claim 1, wherein the micron-scale monocrystal film layer is a lithium niobate monocrystal film, lithium tantalate monocrystal film, or quartz monocrystal film,
wherein the substrate layer is a silicon substrate, lithium niobate substrate, lithium tantalate substrate, quartz substrate, silicon carbide substrate, or sapphire substrate.

7. The micron-scale monocrystal film according to claim 1, wherein the materials for forming the micron-scale monocrystal film layer and substrate layer are the same or different from each other.

8. The micron-scale monocrystal film according to claim 1, wherein from the first transition layer to second transition layer, the content of the element from the substrate layer gradually decreases, and the content of the element from the micron-scale monocrystal film layer gradually increases.

9. The micron-scale monocrystal film according to claim 1, wherein the micron-scale monocrystal film layer has a polished surface or a rough surface with micron- or sub-micron-scale roughness.

* * * * *